(12) United States Patent
Gregory

(10) Patent No.: US 6,266,381 B1
(45) Date of Patent: *Jul. 24, 2001

(54) FREQUENCY CONTROL ARRANGEMENT

(75) Inventor: Paul C Gregory, Westhoughton (GB)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/012,076

(22) Filed: Jan. 22, 1998

(51) Int. Cl.$^7$ ........................................................ H04L 7/00
(52) U.S. Cl. .................. 375/354; 375/372; 375/373; 375/375; 369/59
(58) Field of Search ..................... 375/354, 362, 375/363, 374, 376, 334, 337, 372, 373, 275, 375; 329/302, 325; 369/59, 50, 32; 327/47

(56) References Cited

U.S. PATENT DOCUMENTS

| | | | |
|---|---|---|---|
| 3,982,195 | * 9/1976 | Turner | 329/50 |
| 4,583,211 | * 4/1986 | Nishikawa et al. | 369/59 |
| 4,617,679 | * 10/1986 | Brooks | 375/374 |
| 4,689,581 | * 8/1987 | Talbot | 331/1 A |
| 5,018,169 | * 5/1991 | Wong et al. | 375/373 |
| 5,068,628 | * 11/1991 | Ghoshal | 331/1 A |
| 5,301,196 | * 4/1994 | Ewen et al. | |
| 5,399,995 | * 3/1995 | Kardontchik et al. | |
| 5,475,344 | * 12/1995 | Maneatis et al. | 331/57 |
| 5,757,240 | * 5/1998 | Boerstler et al. | 331/34 |

OTHER PUBLICATIONS greenfield, Practical Digital Design Using ICs, John Wiley & Sons, pp. 182–186, 1983*

* cited by examiner

Primary Examiner—Stephen Chin
Assistant Examiner—Shnwang Liu

(57) ABSTRACT

In a frequency control arrangement 200 of the type comprising an oscillator 270, a mark or space counter 210, a frequency detector 220 and an error signal calculator 230–260, 290 and in which it is desired to control the oscillator 270 to resonate at a frequency substantially equal to the frequency of a received data stream, the oscillator 270 is implemented as a four phase ring oscillator (FIG. 1, ref 110) arranged to provide phased clock signals to the mark or space counter (FIG. 1, ref 100). This allows the mark or space counter to be arranged to measure the length of the marks or spaces of the data with increased resolution.

13 Claims, 2 Drawing Sheets

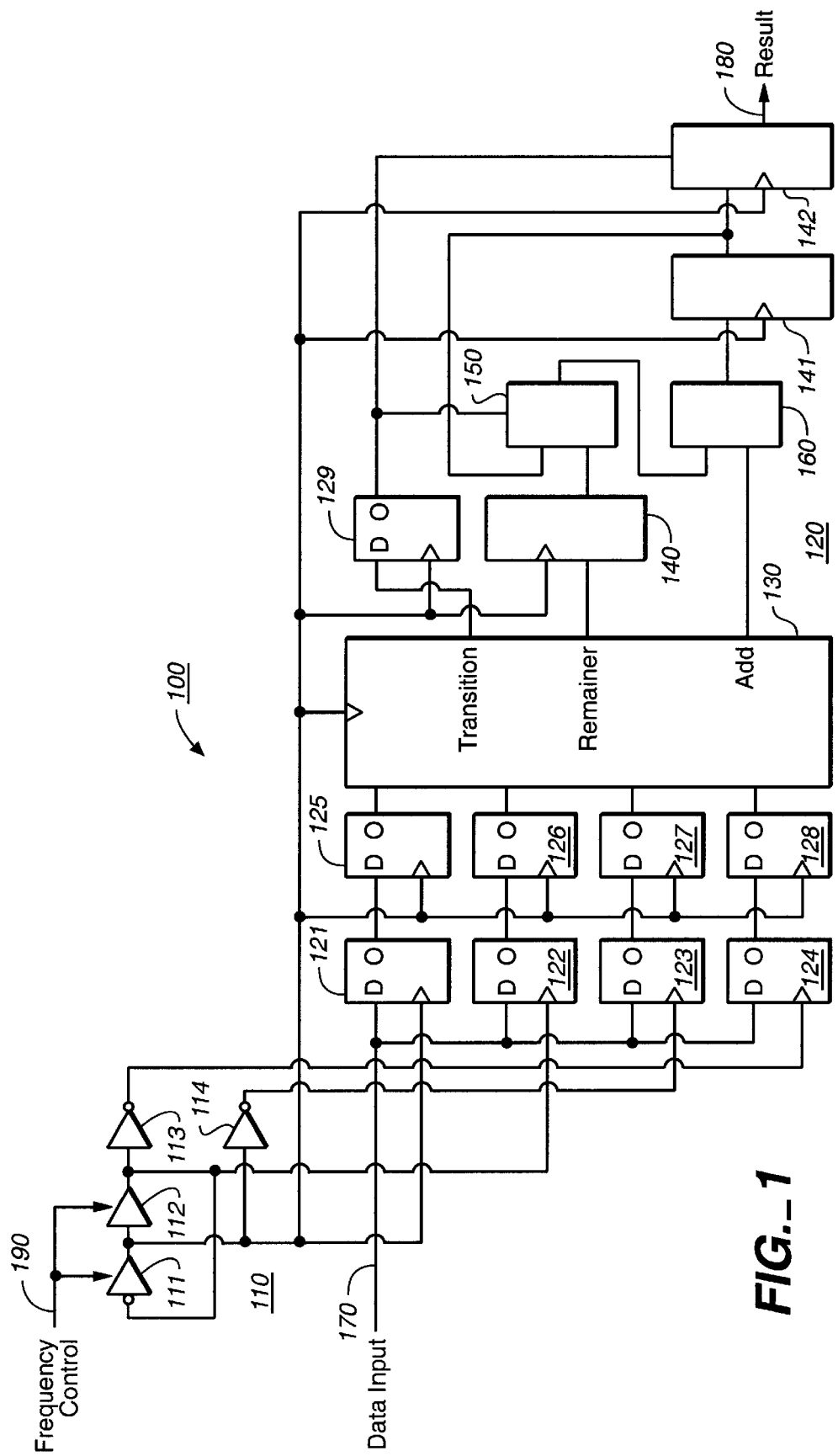
FIG._1

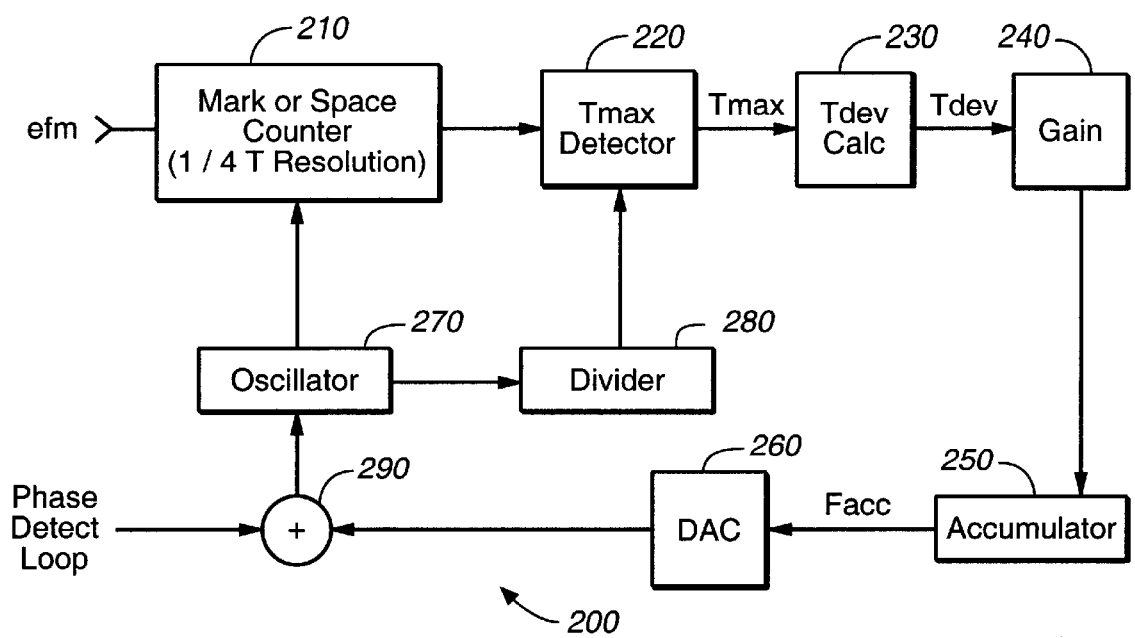
FIG._2

FREQUENCY CONTROL ARRANGEMENT

BACKGROUND OF THE INVENTION

The present invention relates to a frequency control arrangement and more particularly, though not exclusively, to a frequency control arrangement suitable for use in a wideband phase locked loop.

Wideband phase locked loops are widely used in the extraction of data from CD-ROMs and digital video data (DVD) ROMs They are essentially used to generate a clock signal which is synchronous with an incoming efm data signal and to output the clock signal with the efm data signal.

Efm data is required to contain a maximum mark or space at least once in a specified number of data intervals. In the case of CD-ROM. the efm data is required to contain a maximum mark or space of 11 T every 588 written T intervals. DVD-ROM efm data is required to contain a maximum mark or space of 14 T every 1488 written T intervals. This requirement of the efm data allows detector circuitry to be synchronised to the efm data stream by allowing the frequency of the efm data stream to be detected.

This frequency detection is performed digitally by measuring the maximum mark or space but the resolution of the measurement is limited by the clock frequency of the frequency detector circuit. It is not generally possible to increase the clock frequency because the clock signal is output to data recovery circuitry as being synchronous with the incoming efm data stream.

SUMMARY OF THE INVENTION

In accordance with the present invention there is provided a frequency control arrangement comprising an oscillator, a mark or space counter, a frequency detector and an error signal calculator in which it is desired to control the oscillator to resonate at a frequency substantially equal to the frequency of a received data stream, the oscillator being a ring oscillator which is arranged to provide phased clock signals on respective output lines to the mark or space counter thereby to allow the mark or space counter to measure the length of the marks or spaces of the data with increased resolution.

In accordance with another aspect of the present invention there is provided a frequency control arrangement for controlling an oscillator to operate at a frequency substantially equal to the clock frequency of a received stream of data signals, wherein the oscillator is a ring oscillator which is arranged to provide a plurality of clock signals of different phases on respective output lines to a mark or space counter to clock into said counter the instantaneous value of said data signals at a like plurality of intervals within a cycle of said clock frequency.

BRIEF DESCRIPTION OF THE DRAWINGS

An embodiment will now be described, by way of example only, with reference to the accompanying drawings, of which:

FIG. 1 shows a counter used in a frequency control device in accordance with the present invention, and FIG. 2 shows a frequency control device in accordance with the present invention.

DETAILED DESCRIPTION OF THE PREFERRED EMBODIMENTS

Referring first to FIG. 1, mark or space counter 100 comprises ring, oscillator 110 and logic circuit 120.

Ring oscillator 110 comprises controllable delay elements 111 and 112 and invertors 113 and 114. The output electrode of delay element 111 is connected to a first clock line and to the input electrode of delay element 112. The output electrode of delay element 112 is connected to a second clock line and to the input electrode of invertor 113, the output electrode of which is connected to a fourth clock line. Invertor 114 has its input electrode connected to the output of delay element 111 and its output electrode connected to a third clock line. The output of delay element 112 is connected to the inverting input electrode of delay element 111. Delay elements 111 and 112 are each controlled by a signal on frequency control line 190.

Ring oscillator 110 operates to output four-phase clock pulses on the first to fourth clock lines at a frequency dependent on current signal received on frequency control line 190. A ring oscillator which could be used as ring oscillator 110 is described in U.S. Pat. No. 5,304,938.

D-type flip-flops 121–124 are clocked by the first to fourth clock: lines respectively and each have their input connected to data input line 170 to receive incoming efm data. D-types 125–128 have their inputs connected to the respective outputs of D-types 121–124. D-types 125–128 are each clocked by the first clock line and have their outputs connected to first to fourth inputs of logic calculator 130 respectively. Logic calculator 130 has three outputs, a "transition" output, a "remainder" output and an "add" output. The transition output is connected to the input of D-type 129, the remainder output is connected to the input of latch 140 and the add output is connected to a first input of adder 160. The output of D-type 129 is connected to the enable input of latch 142 and to the control input of mux 150. The output of latch 140 is connected to a first signal input of mux 150, then output of which is connected to the second input of adder 160. The output of adder 160 is connected to the input of latch 141. The output of latch 141 is connected to both the input of latch 142 and the second signal input of mux 150. D-type 129, latches 140–142, logic calculator 130 and mux 150 are all clocked by the first clock line. The output of latch 142 is connected to result line 180.

D-types 121–129 each operate to hold as their output, the logic level that is present on their input at the rising clock edge. D-types 121–124 thus present at their respective outputs the data signal present on data input line 170 at four-phase intervals of the clock period. These data signals are clocked at the phase of the first clock by D-types 125–128. This ensures that each of the logic calculator inputs receives different ones of the four-phase clocked data input signal.

Logic calculator 130 comprises a single memory element, which stores the logic value of D-type 128 from the previous cycle, and combinational logic to produce certain output signals, which will now be described.

If, on a clock cycle, any of the four inputs are different from each other or from the value held in the memory element, the transition output will be high. In this case, the add output will be equal to the number of inputs which have the same logic level as that stored in the memory element and the remainder output will be equal to four mints the value of the add output. In all other instances the transition output will be low, the add output will be four and the remainder output will be zero.

The number of successive quadrature clocks on which the same logic level was input on data input line 170 can then be calculated in adder 160 by virtue of latches 140–142, mux 150 and D-type 129.

Where no transition signal is present, adder 160 and latch 141 act as an accumulator. The output from latch 141 is passed through mux 150 to adder 160 where it is summed with the value received from the add output of logic calculator 130.

When logic calculator 130 determines that there is a transition, the following occurs. In the clock cycle where logic calculator 130 makes that determination. D-type 129 receives a logic 1 and latch 140 receives a signal which is greater than zero. Neither of these elements output anything until the next clock cycle. Meanwhile, adder 160 sums the value from the add output of logic calculator 130 with that stored by latch 141 from the previous clock cycle and outputs the result to latch 141. On the next clock cycle, latch 142 is enabled by D-type 129 and thus registers the value output from latch 141. This value is equal to the number of four-phase clocks for which the efm data on data input line 170 remained the same and is output on result line 180. D-type 129 also switches mux 150 so that adder 160 receives the output of latch 140, which holds the remainder value from the previous clock cycle. Adder 160 adds this with the value received from the add output of logic calculator 130, presenting the result to latch 141. Thus, the delayed transition signal allows proper counting of the number of successive four-phase clocks on which the same logic level was received on data input line 170.

Due to the use of ring oscillator 110, the resolution of the measurement of successive marks or spaces has been increased, in this example by a factor of four, from the case where a clock having a frequency approximately equal to the efm data frequency was used.

The output on result line 180 is used to control the frequency of ring oscillator 110 so as to be synchronous with the efm data. A frequency control arrangement for this purpose is schematically shown in FIG. 2.

Referring now to FIG. 2, frequency control arrangement 200 comprises mark or space counter 210, frequency detector 220, error signal calculator 230, programmable gain element 240, digital accumulator 250, DAC 260, summer 290, ring oscillator 270 and divider 280.

On initialisation or resetting of system 200, oscillator 270 is set to oscillate at a frequency at which the incoming efm data is expected. Mark or space counter 210 outputs a series of values to frequency detector 220 which correspond to the counted number of quadrature clock cycles between transitions of the efm data. Frequency detector 220 detects the largest value received from mark or space counter 210 with a resolution of T/4 of the period of oscillator 270.

Divider 280 controls frequency detector 220, to output the detected value to error signal calculator 230 at a rate which guarantees that a maximum interval has been received by mark or space counter 210. This is achieved by dividing the frequency of oscillator 270 by a number equal to twice the number of bits in which the longest mark or space is guaranteed, i.e. 1176 for CD-ROM and 2976 for DVD-ROM.

The detected maximum value is compared with the ideal target value by error signal calculator 230 which outputs a difference value to gain element 240 The output of gain element 240 is fed to digital accumulator 250. Accumulator 250 accumulates received error signals to provide the correct offset to summer 290 The accumulator drives a 10 bit current DAC whose output is summed with a signal output by a phase detection loop to control the frequency of oscillator 270.

A brief explanation of operation when frequency control arrangement 200 is implemented in a PLL now follows.

When the difference value determined by error signal calculator 230 meets a threshold criteria, accumulator 250 stops changing its output and a phase detector (not shown) adjusts oscillator 270, by way of summer 290, to be in phase with the incoming efm data signal. Thus, oscillator 270 is caused to oscillate at the same phase and frequency as the incoming efm data. The output from oscillator 270 can then be used in recovering data from the incoming efm data stream.

Although the embodiment has been described with reference to a four-phase ring oscillator, it will be understood that other ring oscillators could be used instead. Six, eight or sixteen stake ring oscillators would offer further increased resolution in mark or space measurement with only a little extra complexity in the structure of the ring oscillator and the logic circuit.

What is claimed is:

1. A frequency control arrangement comprising a local oscillator arranged to resonate, in use, at a frequency substantially equal to a frequency of a data stream having contiguous marks and spaces each having a predetermined interval, the data stream including a maximum interval representative of at least one of a predetermined number of successive marks and spaces, the maximum interval occurring at least once during a predetermined time, the frequency control arrangement further comprising:

means for generating a plurality of phased clock signals derived from a cycle in the frequency of the local oscillator;

means for sampling the marks and spaces at a rate of the plurality of phased clock signals to produce a plurality of logic values; and means for accumulating the plurality of logic values into a counted number of clock cycles during each cycle in the frequency of the local oscillator.

2. The frequency control arrangement in accordance with claim 1 in which the phased clock signals are used by logic devices to clock the data signal at regular periods within the cycle of the oscillator.

3. The frequency control arrangement in accordance with claim 2 in which the logic devices are D-type flip-flops, the outputs of which are clocked into a logic calculator by a common clock signal.

4. The frequency control arrangement in accordance with claim 1 in which the instantaneous value of the efm data steam is clocked into said counter at the plurality of intervals by D-type flip-flops, the outputs of which are clocked into a logic calculator by a common clock signal.

5. The frequency control arrangement in accordance with claim 1 in which an adder and a latch cooperate to accumulate the plurality of logic values into the counted number of clock cycles for which the data stream remains unchanged.

6. The frequency control arrangement of claim 1, further comprising:

means for identifying the maximum interval from the counted number of clock cycles; and means for controlling the frequency of the local oscillator in response to the counted number of clock cycles, thereby to synchronise a period associated with the frequency of the local oscillator to the predetermined interval.

7. The frequency control arrangement of claim 1, wherein the means for controlling the frequency of the local oscillator further comprises:

an error signal calculator arranged to identify a count error between an expected number of phased clock signals for the maximum interval and an actual number of phased clock signals recorded against the maximum interval.

8. The frequency control arrangement of claim 1, wherein the local oscillator is a ring oscillator.

9. The frequency control arrangement of claim 1, contained with one of a CD-ROM and a DVD-ROM drive.

10. A method of synchronising a period of a local oscillator substantially to a predetermined interval of a data stream comprising contiguous marks and spaces each having the predetermined interval, the local oscillator providing a frequency substantially equal to a frequency of the data stream and wherein the data stream contains a maximum interval representative of at least one of a predetermined number of successive marks and spaces, the maximum interval occurring at least once during a predetermined time, the method comprising:

generating a plurality of phased clock signals from the local oscillator, the phased clock signals derived from a cycle of the frequency of the local oscillator;

sampling the marks and spaces at a rate of the plurality of phased clock signals to produce a plurality of logic values;

accumulating the plurality of logic values into a counted number of clock cycles during each cycle in the frequency of the local oscillator;

identifying the maximum interval from the counted number of clock cycles; and controlling the frequency of the local oscillator in response to the counted number of clock cycles recorded against the maximum interval, thereby to effect synchronisation of the period of the local oscillator to the predetermined interval.

11. A frequency control arrangement for use with a data stream, the data stream having a maximum interval occurring at least once during a predetermined time, the maximum interval representative of a predetermined number of successive marks or spaces, the frequency control arrangement comprising:

a local oscillator configured to produce a plurality of phased clock signals during a cycle; and a counter configured to (i) sample the marks and spaces in the data stream at the plurality of phased clock signals to produce a plurality of logic values, and (ii) accumulate the plurality of logic values into a counted number of clock cycles during each cycle of the local oscillator.

12. The frequency control arrangement in accordance with claim 11 wherein the counter comprises:

a plurality of flip-flops configured to sample the marks and spaces in the data stream to produce a plurality of logic values;

a logic calculator configured to present an add output and a remainder output responsive to the plurality of logic values; and an accumulator configured to present the counted number of clock cycles responsive to the add output and the remainder output.

13. The frequency control arrangement in accordance with claim 12 wherein the plurality of flip-flops comprises:

a first plurality of flip-flops, each flip-flop of the first plurality of flip-flops being configured to sample the marks and spaces in the data stream in accordance with one phased clock signal of the plurality of phased clock signals respectively; and a second plurality of flip-flops disposed between the first plurality of flip-flops and the logic calculator, the second plurality of flip-flops being configured to clock together on a selected phased clock signal of the plurality of phased clock signals.

* * * * *